(12) United States Patent
Hewavithana et al.

(10) Patent No.: US 12,328,152 B2
(45) Date of Patent: Jun. 10, 2025

(54) METHOD AND APPARATUS FOR DETECTING AND LOCATING A FAULT IN A CABLE NETWORK

(71) Applicant: MAXLINEAR, INC., Carlsbad, CA (US)

(72) Inventors: Thushara Hewavithana, Hatfield (GB); Shaul Shulman, Ramat Gan (IL); Nathan Goichberg, Ashdod (IL)

(73) Assignee: MAXLINEAR, INC., Carlsbad, CA (US)

( * ) Notice: Subject to any disclaimer, the term of this patent is extended or adjusted under 35 U.S.C. 154(b) by 0 days.

(21) Appl. No.: 15/978,214

(22) Filed: May 14, 2018

(65) Prior Publication Data

US 2019/0044626 A1     Feb. 7, 2019

(51) Int. Cl.
| | |
|---|---|
| *H04B 17/17* | (2015.01) |
| *G01R 31/08* | (2020.01) |
| *G01R 31/11* | (2006.01) |
| *H04B 3/23* | (2006.01) |
| *H04B 17/10* | (2015.01) |

(Continued)

(52) U.S. Cl.
CPC .......... *H04B 17/17* (2015.01); *G01R 31/088* (2013.01); *G01R 31/11* (2013.01); *H04B 3/23* (2013.01); *H04B 17/104* (2015.01); *H04B 17/14* (2015.01); *H04L 12/2801* (2013.01); *H04L 12/2898* (2013.01); *H04L 25/0212* (2013.01); *H04L 25/0222* (2013.01)

(58) Field of Classification Search
CPC ........ H04B 3/46; H04B 17/17; H04B 17/104; H04B 17/14; H04L 41/0677; H04L 41/0659; H04L 12/2801; H04L 12/2898; H04L 25/0212; H04L 25/0222; G01R 31/021; G01R 31/088; G01R 31/11
USPC ....................................................... 375/222
See application file for complete search history.

(56) References Cited

U.S. PATENT DOCUMENTS

| | | | | |
|---|---|---|---|---|
| 4,520,476 | A | * | 5/1985 | Searl .................... H04B 1/56 370/278 |
| 2007/0002728 | A1 | * | 1/2007 | Fujii ................. H04L 25/0206 370/210 |

(Continued)

OTHER PUBLICATIONS

European Search Report for European Application No. 23177603, dated Oct. 20, 2023, 7 pages.

(Continued)

*Primary Examiner* — Kevin M Burd
(74) *Attorney, Agent, or Firm* — Buchalter; Jason W. Croft

(57) ABSTRACT

A method and apparatus for detecting and locating a fault in a cable network. A cable modem may perform channel estimation to obtain a time domain channel response on an echo channel in a cable network. The cable modem then analyzes the time domain channel response to determine whether there is any change from a previously obtained time domain channel response on the echo channel. If there is a change from the previously obtained time domain channel response, the cable modem may generate an alert for a fault in the cable network and estimate a location of the fault based on the time domain channel response. Calibration may be performed to determine a reference latency for a reflection occurred inside the cable modem, and the location of the fault may be estimated based on the reference latency.

16 Claims, 6 Drawing Sheets

(51) Int. Cl.
H04B 17/14 (2015.01)
H04L 12/28 (2006.01)
H04L 25/02 (2006.01)

(56) References Cited

U.S. PATENT DOCUMENTS

| | | | |
|---|---|---|---|
| 2007/0280366 A1* | 12/2007 | Aytur | H04L 25/022 |
| | | | 375/260 |
| 2013/0272343 A1* | 10/2013 | Zhang | H04L 25/0212 |
| | | | 375/148 |
| 2013/0290791 A1* | 10/2013 | Basile | H04L 43/00 |
| | | | 714/47.1 |
| 2014/0316726 A1* | 10/2014 | Franchet | G01R 31/11 |
| | | | 702/59 |
| 2017/0033949 A1* | 2/2017 | Eitan | H04L 25/0204 |
| 2017/0034507 A1* | 2/2017 | Harris | H04N 17/004 |
| 2017/0104522 A1 | 4/2017 | Zinevich | |
| 2017/0134215 A1* | 5/2017 | Chini | H04L 41/0631 |
| 2017/0310539 A1 | 10/2017 | Jin | |
| 2018/0205532 A1* | 7/2018 | Chapman | H04L 27/122 |
| 2018/0287770 A1* | 10/2018 | Barr | H04L 65/1101 |
| 2019/0190684 A1* | 6/2019 | Bowler | H04L 12/2801 |
| 2019/0268037 A1* | 8/2019 | Ramesh | H04B 3/23 |
| 2020/0072895 A1* | 3/2020 | Auzanneau | G01R 31/11 |

OTHER PUBLICATIONS

Extended European Search Report for European Application No. 19169130.2, mailed Oct. 23, 2019, 09 Pages.

* cited by examiner

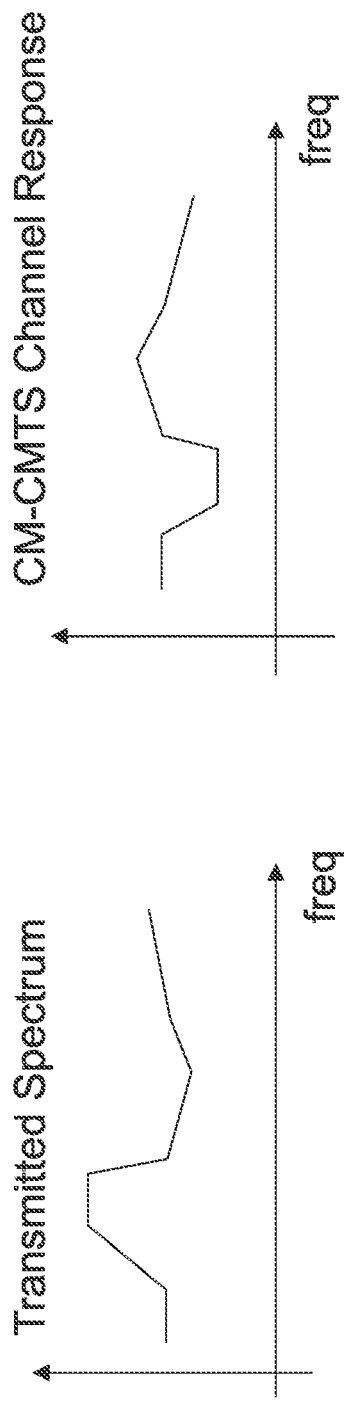
FIG. 2A
FIG. 2B
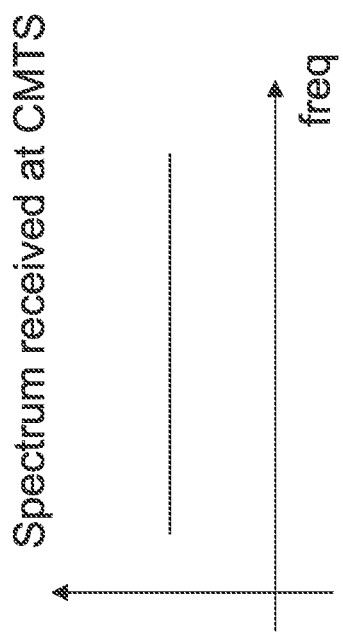
FIG. 2C

METHOD AND APPARATUS FOR DETECTING AND LOCATING A FAULT IN A CABLE NETWORK

FIELD

Examples relate to detecting and locating a fault in a cable network, more particularly, a method and apparatus for detecting and locating a fault in a cable network by means of echo channel estimation by a cable modem.

BACKGROUND

In a networking environment, problems may arise that may affect the capacity of certain network devices to communicate with other network devices. In some cases, these problems may be related to the physical cabling component of the network infrastructure such as cables and sockets that connect the network devices. In such cases identifying the particular cable or socket that is causing the problem may be difficult since there may be numerous potential sources that cause the problems.

Monitoring the network by cost effective means is of a critical value to cable network operators, due to huge operating expenses for identifying and fixing network faults. Robust monitoring capability is a significant differentiator for a cable modem maker.

BRIEF DESCRIPTION OF THE FIGURES

Some examples of apparatuses and/or methods will be described in the following by way of example only, and with reference to the accompanying figures, in which

FIGS. 2(a)-(c) show concepts of implementing pre-equalization at a cable modem;

DETAILED DESCRIPTION

Figure 1:
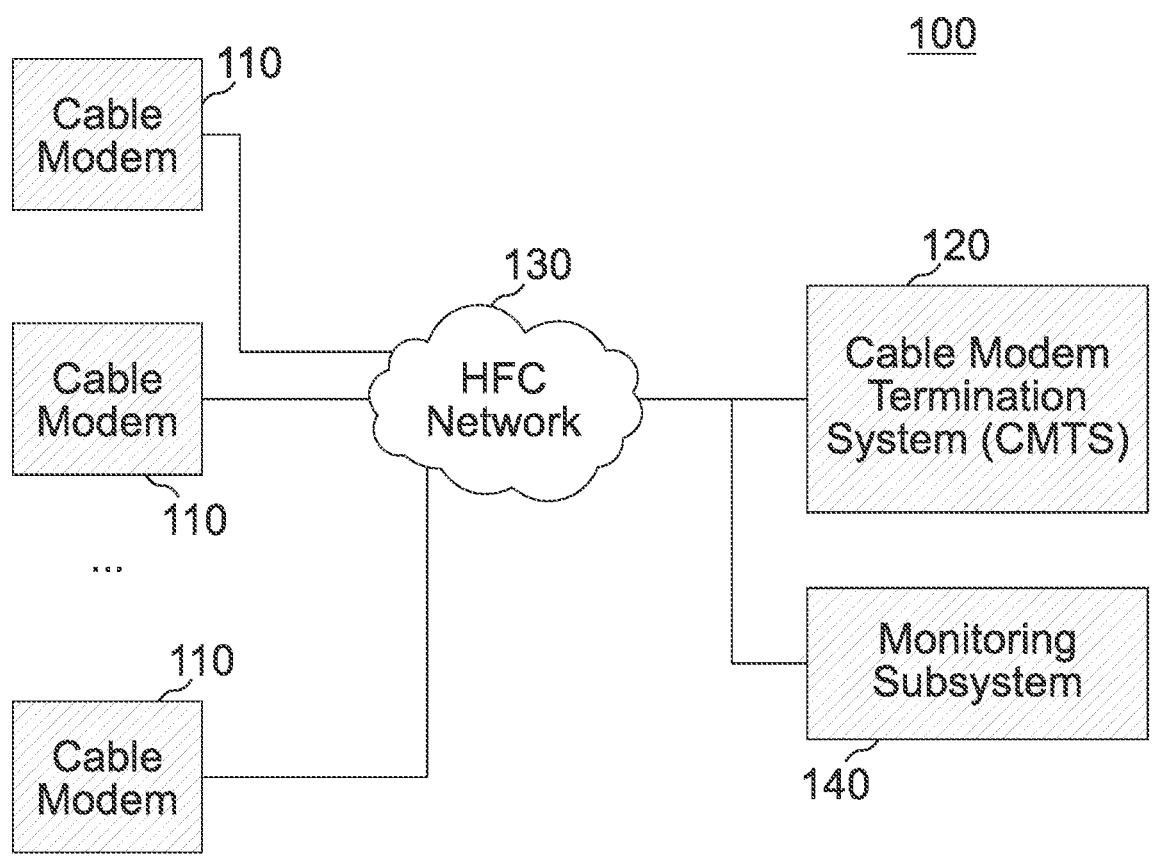
FIG. 1 is an example cable network.

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

In examples, a cable modem (e.g. a DOCSIS 3.1 full duplex (FDX)-compatible cable modem) may have echo cancellation capabilities and/or channel estimation capabilities and the echo cancelling and/or channel estimation capabilities of the cable modem may be used to accurately and independently detect and locate faults in the cable infrastructure. The examples disclosed herein may be used by the cable network operators to detect and locate faults either proactively or as a response to service calls.

The examples will be explained with reference to a cable modem operating in a cable network under a DOCSIS 3.1 FDX standard. However, the examples may be used in other network devices in a cable network, such as a cable modem termination system (CMTS) and may be implemented in any type of wired communication networks operating under any standards.

DOCSIS 3.1 FDX-compatible cable modems may use echo cancelling techniques while transmitting and receiving in an FDX frequency band. Echo cancelling requires a channel response estimation. In examples, a time domain echo channel response (obtained by transforming a frequency domain channel response to the time domain echo channel response or obtained directly in time domain) may be used to identify specific reflections from the cable network and estimate the distance from the cable modem to the reflections. It may also be used to indicate an alert to the network in case that the channel (seen by the cable modem in terms of channel response) changes significantly (which may indicate an appearance of a new problem in the cable infrastructure).

The methods in accordance with the examples disclosed herein are most efficient to detect cable plant issues that may happen in a proximity range of a cable modem (from a cable modem to a tap, including a drop cable, a home network, a wall plate, etc.) which may be the most challenging for the CMTS-based and other monitoring tools.

Implementation of the methods disclosed herein helps to turn a cable modem into an efficient proactive network monitoring (PNM) tool, which can be used independently or complementary to the CMTS and/or dedicated monitoring tools to provide more accurate results, alerts, and indications about potential cable plant issues.

FIG. 1 is an example cable network 100. The multiple systems operators (MSOs) infrastructure (e.g. a DOCSIS network) includes two primary components: a cable modem 110 and a CMTS 120 that are connected via a hybrid fiber-coax (HFC) network 130. The cable modem 110 is located at or near the customer premises and the CMTS 120 is located at the cable network headend. The cable modem 110 may or may not be a DOCSIS 3.1 FDX-compatible cable modem. Regardless of the support of DOCSIS 3.1 FDX standard, the examples disclosed herein may be implemented in a cable modem 110 having a channel estimation capability. The cable network 110 may include a monitoring subsystem 140 (e.g. a monitoring server) for monitoring potential faults, issues, etc. The monitoring subsystem 140 may be a standalone server or may be included in the CMTS 120 or any other network entity in the cable network 100.

In legacy systems, up to and including DOCSIS 3.1, a frequency division between the upstream transmit and downstream receive frequency bands was mandated. In DOCSIS 3.1 FDX standard this is not the case anymore. The DOCSIS 3.1 FDX specification currently allows up to 3 FDX sub-bands in the FDX band. An FDX cable modem may use each of these sub-bands as either upstream or downstream.

While a cable network 100 operates in FDX, a cable modem 110 in an FDX-mode cable network may operate on separate frequency bands for upstream and downstream (i.e. in a frequency division duplex (FDD) mode) to avoid upstream-to-downstream interference in an FDX band. However, there is no filter between transmit and receive sub-bands within the FDX band, and therefore echoes, i.e. transmissions reflected from various points in the cable plant (e.g. the facilities that link a central office to subscribers including the local loops and their associated equipment, which includes cables, junction boxes, load coils, and other structures) and the cable modem itself become a limiting factor for the cable modem receiver.

In order to cope with the echo, various echo cancelling techniques may be implemented in a cable modem 110. The echo cancellation techniques may obtain a digital estimation of the echo channel response, and then use the echo channel response to generate an echo cancelling signal and inject it into a receive chain, based on the transmitted signal but with properties targeted to cancel out the echo. An FDX cable modem performs training of an echo cancelling filter(s) as part of its echo cancelling functionality, without any relation to PNM.

The HFC network 130 is a complex distributed infrastructure that is prone to external damages due to numerous causes, such as weather, aging of components, construction work, user mistakes, animal damage, and the like. Cable network operators strive to develop capabilities of early detection of cable plant problems and determination of the location of the plant problems as well. The return path (i.e. upstream) direction is particularly challenging in that regard due to the fact that it is shared by multiple transmitters making it complicated to detect the source of the fault, while the forward path (i.e. downstream) is only used by the CMTS. The monitoring will be even more challenging in FDX operations because the same spectrum is used for transmissions and receptions simultaneously.

Challenges of the monitoring system is to be able to reliably and accurately detect the faults in the cable network before they start affecting subscribers, to reduce service calls and the degraded service time, and to minimize truck rolls and the required time and effort for field technicians to locate the fault.

Traditionally the cable network operators would respond to issues rather than proactively detect and prevent the issues before they impact on subscriber services. Following a service call (or multiple service calls in marginal cases) a technician would get to the geographic area of the reported problem and, if the suspected issue is with the cable plant, the technician would start locating the fault using "divide and conquer" meaning connecting to the cable plant in different points of different nodes in an attempt to narrow down the potential fault areas, at times having to disconnect a part of a node from service. This is an inefficient process, requiring truck roll, coordination between the field technician and headquarters/CMTS and would be especially problematic with marginal cases (e.g. the issue disappears exactly when the technician arrives, etc.).

Commercially available or operator-proprietary network monitoring tools are sometimes able to provide additional insight on the return path but they may still require truck rolls, additional monitoring hardware in the plant, and they normally provide only partial assistance in locating faults in the cable plant, if any.

Proactive early fault detection can partially be done by analyzing the cable modem pre-equalizer coefficients, as the cable modem pre-equalizer is used to compensate for the problems in the HFC plant and therefore the coefficients contain useful information about the cable plant. Pre-equalization of the cable modem transmissions may be used in cable networks. Pre-equalization is managed by the CMTS, and it "conceals" issues in the cable plant by compensating for the channel response in the cable modem transmitter, giving the operator some time to address the fault before it starts affecting service.

FIGS. 2(a)-(c) show concepts of implementing pre-equalization at a cable modem. FIG. 2(a) shows an example pre-equalized transmitted spectrum, FIG. 2(b) shows an example CM-CMTS channel response, and FIG. 2(c) shows an example spectrum received at the CMTS after pre-equalization. The cable modem pre-distorts the transmission to revert the channel so that the CMTS receives ideally a flat spectrum as shown in FIG. 2(c). The CMTS sets the pre-equalizer coefficients at the cable modem according to the channel response that it sees from the cable modem transmitter to the CMTS receiver.

Early detection using analysis of the pre-equalizer coefficients may give the cable operator time to address the problem before it starts affecting subscribers. Current PNM tools utilize the pre-equalizer coefficients to detect plant issues. When the pre-equalizer is working "hard," then there may be an underlying issue that is affecting the channel response.

The pre-equalization-based methods, however, have several disadvantages. Pre-equalization is controlled by the CMTS, and the CMTS does not see all underlying issues in the cable plant. It is also less effective with several simultaneous underlying issues. Distances that can be calculated using the pre-equalization coefficients analysis are between the fault locations and reflection points in the cable plant, and not between the modem and the fault locations. It may not be able to detect faults if the fault is closer to the cable modem and the loss of the channel to the CMTS is high, or if the distance/loss from the reflection point is high. A plant fault causing a reflection may only slightly alter the pre-equalization coefficients if the new reflection is not reflected significantly back at the CMTS direction. This would be acceptable for the communication channels because in this case there is no need of strong compensation but it would inhibit early detection of the fault by a monitoring system.

Examples disclosed herein provide methods for early detection of occurrence of cable plant faults and the location of the cable plant faults by a cable modem 110 (e.g. a DOCSIS 3.1 FDX-compatible cable modem). For example, the cable modem 110 may implement echo cancelling using filters in a digital domain and/or in an analog domain.

In DOCSIS 3.1 FDX, since the cable modems 110 may transmit and receive simultaneously in the same frequency band on adjacent frequencies without a filter separating the transmit and receive signals, echoes (reflections) from different points outside and inside the cable modem 110 may be seen at the cable modem receiver. The cable modem receiver needs to cancel out the echo to minimize impact on a dynamic range of the receiver components and a noise floor.

Figure 3:
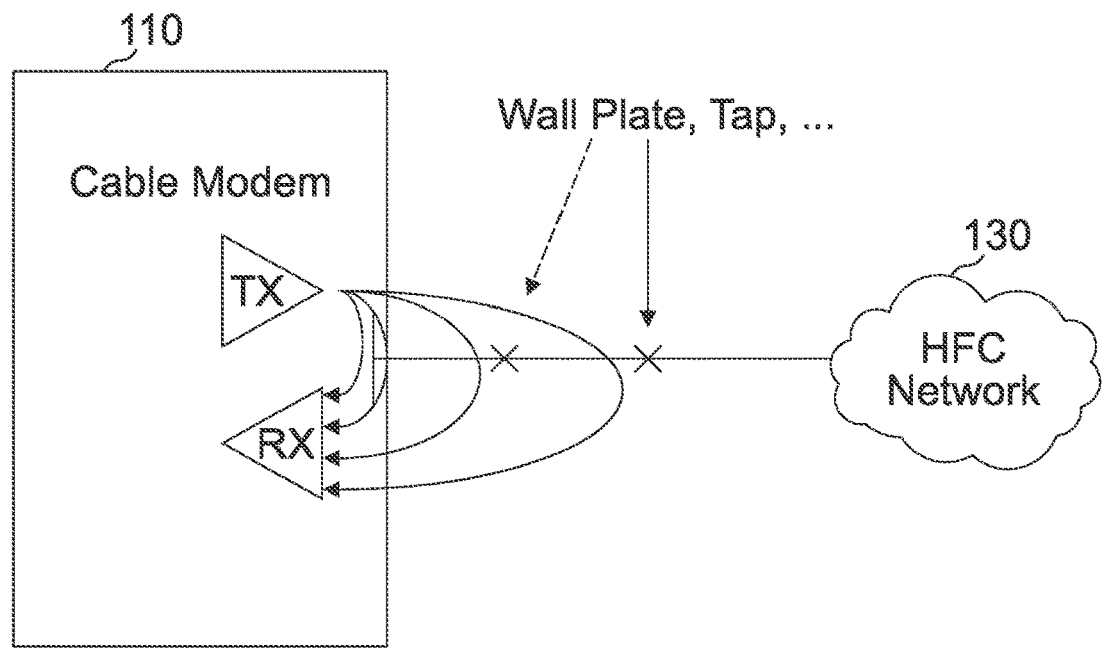
FIG. 3 shows examples of transmission reflections (echoes) occurred in and out of a cable modem.

FIG. 3 shows examples of transmission reflections (echoes) occurred in and out of a cable modem 110. The signal transmitted by the cable modem 110 may be reflected at various points inside and outside of the cable modem 110, such as at an F-connector, a wall plate, a tap, a cable, etc. and return to the cable modem 110.

Figure 4:
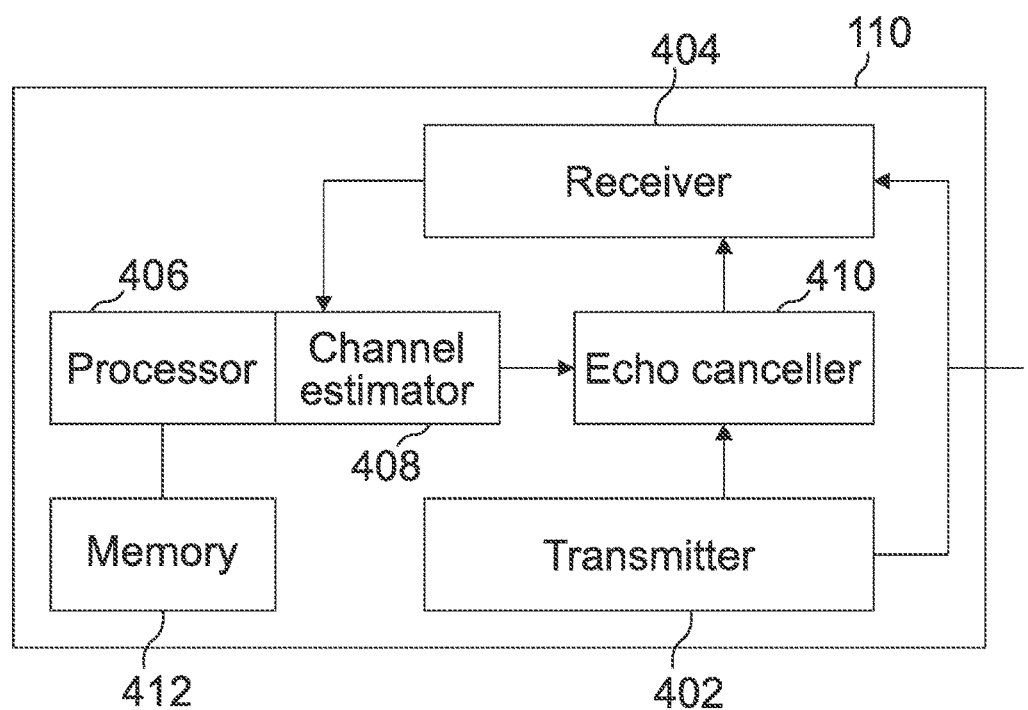
FIG. 4 is a diagram of an example Data Over Cable Service Interface Specification (DOCSIS) 3.1 full duplex (FDX) cable modem in accordance with one aspect.

FIG. 4 is a diagram of an example cable modem 110 in accordance with one aspect. The cable modem includes a transmitter 402, a receiver 404, a processor 406, a channel estimator 408, etc. The cable modem 110 may also include an echo canceller 410. A transmit signal transmitted by the transmitter 402 goes out to the cable network and is reflected from various points inside and outside of the cable modem 110. The reflected signals can be represented as a transfer function of the transmitted signal (i.e. echo channel). The echo canceller 410 including an echo cancellation filter generates an echo cancellation signal, and the echo cancellation signal is injected into the receiver 404 for canceling out the echo.

The channel estimator 408 performs channel estimation periodically or non-periodically to obtain (time domain) channel responses on an echo channel at a cable modem 110. Any conventional channel estimation may be employed to obtain the channel response either in frequency domain or time domain. The channel responses may be stored in the memory 412 as historic data, which will be explained in detail below.

The processor 406 analyzes the time domain channel response to determine whether there is any change from a previously obtained time domain channel response(s) that are stored in the memory 412. The processor 406 may decide that there is a fault if there is a change from the previously obtained time domain channel response(s), for example if there is a new peak above a threshold in the time domain channel response. The processor 406 may determine a location of the fault in the cable network based on the time domain channel response, which will be explained in detail below.

In order to cancel the echo, an echo channel needs to be estimated. Regardless of the channel estimation method, the echo channel response may be modelled in either frequency domain or time domain. For example, in cable communication systems that utilize orthogonal frequency division multiplex (OFDM) transmissions the channel estimation may be performed in a frequency domain and the frequency domain channel response may be transformed into a time domain channel response. Alternatively, the channel response may be obtained in time domain. The echo channel estimation may be performed continuously or periodically or non-periodically (e.g. in response to a trigger, etc.) during the cable modem operation.

Calculation of the echo channel response may be performed for individual channels (e.g. 3 sub-bands in an FDX band). For example, the echo channel response may be estimated using an appropriate echo channel estimation method from the FDX DOCSIS specification based on whether each sub-band is configured as an upstream channel or a downstream channel. The reference signal (i.e. the interference input to the interference channel) needed to estimate the echo channel may be obtained using different techniques. In one examples, the reference signal may be tapped off from a transmit signal from the transmit analog front-end (AFE) output (e.g. at a coupler) and converted to digital though an analog-to-digital converter (ADC). This may be useful, in particular, when it is needed to get a copy of adjacent leakage interference (ALI) signal due to an FDX upstream channel. In another example, the reference signal may be obtained by taking the digital upstream signal from the transmit digital modulator. This may be relevant when a copy of the in-band upstream signal itself is needed, which acts as adjacent channel interference (ACI) for FDX downstream channels. An output of the echo channel may be derived from the output of the ADC in a receive data path.

The upstream self-interference in a FDX-mode cable network has two elements: ACI due to an in-band high power upstream signal, and ALI due to out-of-band leakage of an upstream signal, which may be in-band of a downstream channel. ACI can cause saturation of a downstream ADC, which would require additional back off and hence losing the ADC dynamic range. On the other hand, ALI directly affects the modulation error ratio (MER) of a downstream channel acting as an in-band interferer. It may be needed to cancel the ALI and the ACI by around 30 dB in order to remove the effects of self-interference on a cable modem. The cable modem needs to deal with high power adjacent channels as well as the leakage from these adjacent channels into the downstream channels.

For ALI and ACI, the output signals need to be processed differently to work out the output of the interference channel. First step is to channelize the output to get signal for the individual channels (e.g. 3 sub-bands of the FDX band) to get individual signals for each channel. The same channelization may be performed for the reference signal to get a reference signal for individual channels. Echo channel estimation for individual sub-bands may be performed using these per-channel echo channel input and output signals.

The ALI signal level is likely to be lower than the downstream signal. In this case, the downstream signal may be subtracted from the received signal to extract the ALI signal. FDX specification gives provisions to do this using either pilots or downstream zero-bit loaded (ZBL) symbols (i.e. known sub-carrier modulation) in downstream. For ACI case, the downstream power level is lower than the ACI signal. Therefore, the downstream signal can be treated as noise as far as echo channel estimation for ACI channels is concerned.

Convergence of echo channel coefficients may be done on a per-channel basis as mentioned above. Conventional channel estimation techniques may be used for the per-channel channel estimation. For examples, conventional averaging-based channel estimation or adaptive algorithm, such as normalized least mean square (NLMS), may be used. For averaging-based method, a noisy time domain impulse response (IR) of an echo channel may be calculated by deconvolving the output (S_output) from the echo channel and the input (S_input) to the echo channel as follows:

$$EC\_channel_{IR}=deconv(S\_output, S\_input).$$

This may be implemented in a frequency domain as pointwise division of signal frequency responses (FR), taking care of cyclic convolution issues, etc. Ignoring steps such as overlap-add method which are needed to deal with cyclic convolution issues, steps needed for frequency domain channel estimation calculations are as follows:

$$S\_input_{FR}=DFT\{S\_input\},$$

$$S\_output_{FR}=DFT\{S\_output\},$$

$$EC\_channel_{FR}=S\_output_{FR}/S\_input_{FR}.$$

DFT{.} is a discrete Fourier transform operation. The calculation of the echo channel frequency response, $EC\_channel_{FR}$, above uses pointwise division of the input/output frequency domain vectors.

Once the noisy $EC\_channel_{FR}$ is calculated it may be averaged over multiple training periods to get a more accurate channel estimate as follows:

$$EC\_channel_{FR}=E\{EC\_channel_{FR}\}.$$

In examples, the methods for proactive network monitoring are based on the fact that changes in the cable plant normally cause change in the channel seen by the cable modem 110. For example, the HFC plant normally has a coaxial part at least in the proximity of the cable modem 110, and sometimes all the way to the head-end. The coaxial cables are prone to various damages including corrosion, physical damage due to ageing, weather, and various other causes.

When something in the physical properties of the cable changes (e.g. damaged shielding, corrosion of the inner conductor, etc.) this changes the impedance of the cable, because the target impedance is achieved by using the correct physical properties of the cable. When an impedance mismatch happens in the cable, this normally results in an unwanted reflection of part of the transmitted wave in the direction of the source. The reflected wave will be accounted for in the echo channel estimation because it will change the response of the channel seen by the cable modem 110 due to the resulting constructive/destructive interference.

The echo channel estimation in a frequency domain describes the transfer function of the channel per frequency and may be derived from comparison of the source signal to the reflected signal. In time domain this echo channel estimation can be used to describe the returned signal in time domain, and, for a given source signal (e.g. delta function), can describe the signal that will be received from the echo channel depending on the time since the transmission.

The examples are independent of the method that a cable modem 110 uses to estimate the echo channel. The particular method used to estimate a channel impulse response is not an issue, and any method for channel estimation may be used. In examples, merely the information contained in an echo channel response is used for network fault detection. The channel frequency response (FR) need to be transformed to a time domain channel impulse response (IR). In this regard the cable modem 110 may combine the frequency responses from the individual channels (e.g. 3 sub-bands of the FDX band) to form a wider-band frequency response, which in effect may give higher time resolution in impulse response obtained using an inverse discrete Fourier transform (IDFT) below. Better time resolution may be useful as this allows to separate individual echoes with higher precision.

$$EC\_channel_{IR}=IDFT\{SmoothingWindow(EC\_channel_{FR})\}.$$

IDFT{.} is an inverse discrete Fourier transform operation. Application of a smoothing window to the frequency response may help ironing out edges in the frequency response. Any edges in the frequency response due to sub-band edges, etc. may be tapered down to zero. This may help localizing energy in individual echoes by reducing their side lobes. Hence the possibility of spurious echoes due to side lobes may be reduced.

Whenever a cable damage or any other fault occurs, at the point of damage or fault a new reflection point may be created. Therefore, analysis of the time domain channel coefficients of the echo channel may show a new peak indicating the reflection at the point of the cable damage or fault and provide indication of the time that it takes for the incident wave to be reflected and returned to the cable modem.

Figure 5:
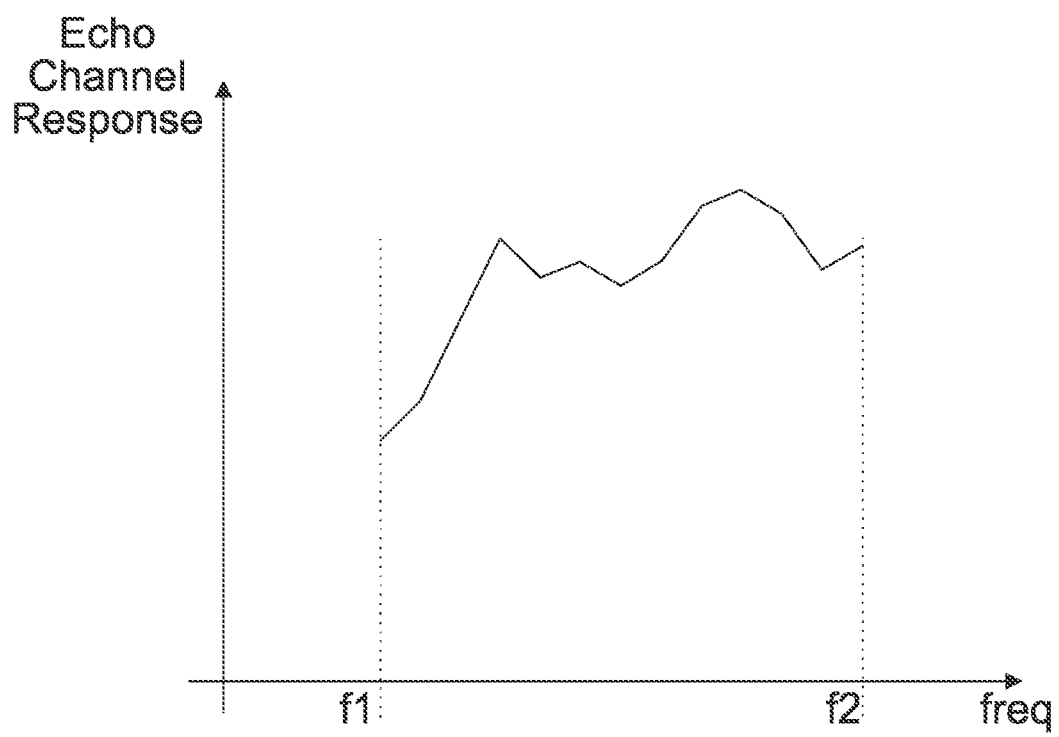
FIG. 5 shows an example of a channel frequency response between two reference frequencies.

FIG. 5 shows an example of a channel frequency response between two reference frequencies. The information can be used to compensate each subcarrier of an OFDM signal according to the frequency response of the channel at the subcarrier's frequency.

Figure 6:
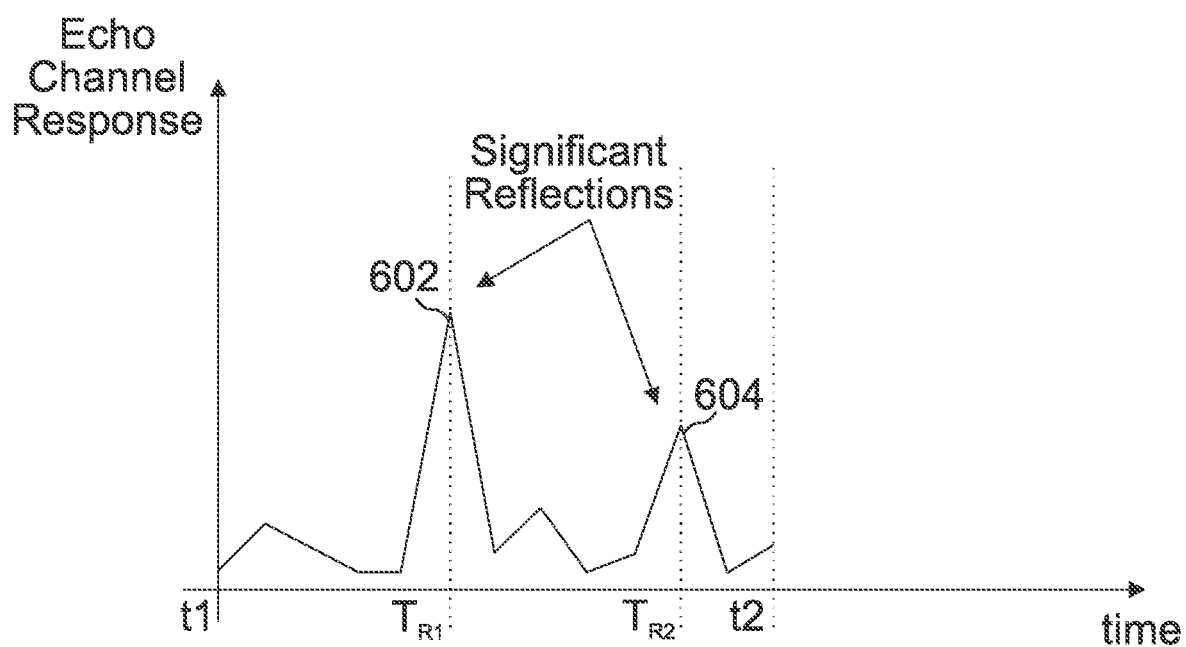
FIG. 6 shows an example of the representation of the echo channel response in time domain.

FIG. 6 shows an example of the representation of the echo channel response in time domain. The channel response in frequency domain in FIG. 5 and the channel response in time domain in FIG. 6 are separate examples and are not related.

Since the echo channel estimation may be performed by the transmitting cable modem 110 relative to the transmission, the echo detection can be referenced to the transmission to calculate the elapsed time from the transmission to its reflection detection at the cable modem receiver. In example methods, the actual cable modem transmissions are used instead of an impulse or a step transmission.

In the example in FIG. 6, $t_1$ is the transmission time of a narrow pulse (e.g. delta function in time domain), and the first significant reflection 602 is detected at the cable modem input after $(t_{R1}-t_1)$ and the second significant reflection 604 is seen at the cable modem input after $(t_{R2}-t_1)$.

The parameters needed to calculate the actual distances to the reflection points are as follows: (1) the elapsed time from the transmission to the detection of the last reflected signal from the inside of the cable modem 110 (e.g. from the F-connector at the cable modem side and before) at the receiver, and (2) the estimation of the propagation velocity of the electromagnetic wave in the cable medium (e.g. a coaxial cable medium).

Figure 7:
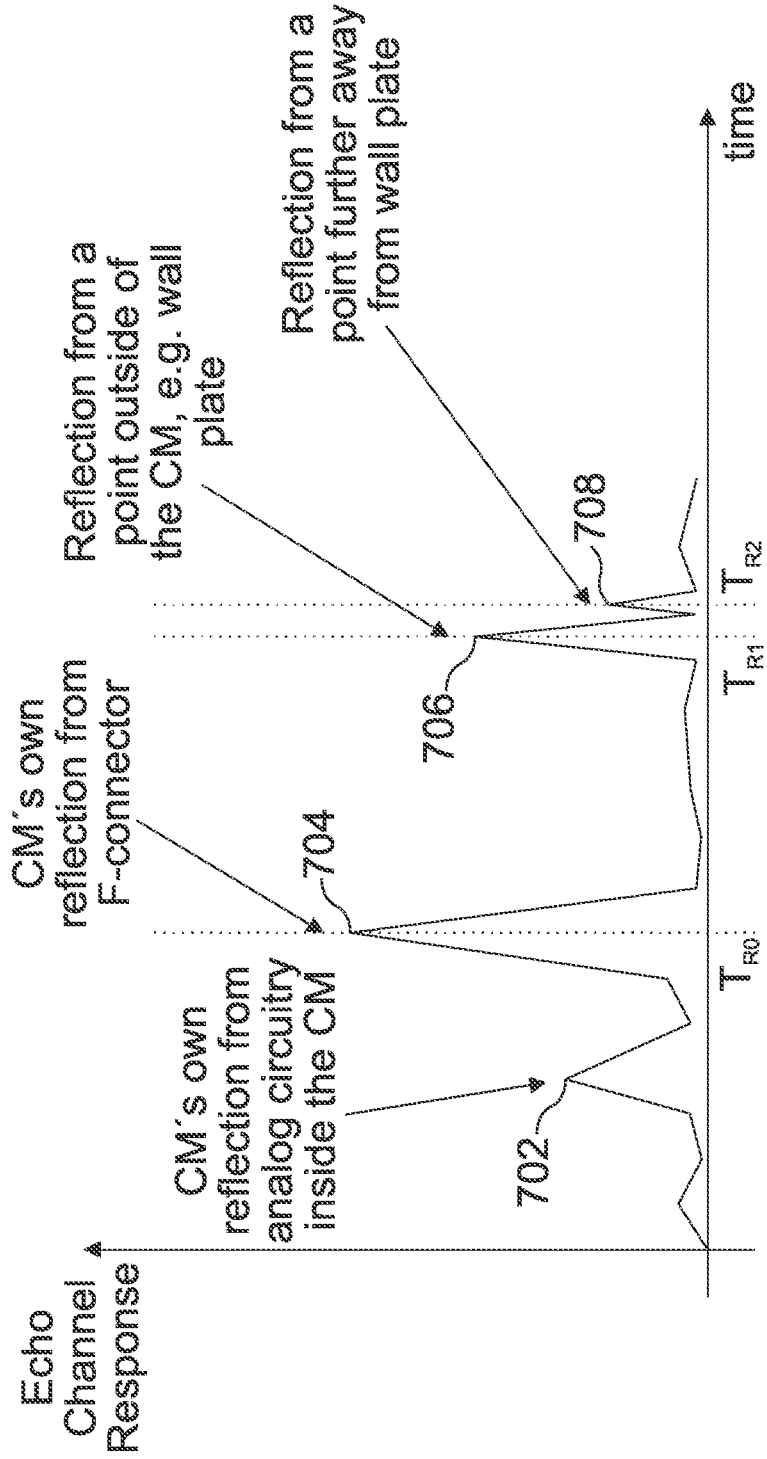
FIG. 7 is an example of break-down of a cable modem time-domain channel response.

It is assumed that the cable modem 110 obtained the time domain channel response in FIG. 7, as estimated by the echo channel estimation mechanism of the cable modem 110. FIG. 7 is an example of break-down of a cable modem time-domain channel response. In the example shown in FIG. 7, the first detected several reflections 702, 704 may be from the cable modem own circuitry (e.g. analog circuitry inside the cable modem 110). These may be factory calibrated by transmitting a reference pulse and measuring the time domain channel response with the F-connector terminated. The termination will effectively prevent further reflections and the reflections that would be detected are from the cable modem itself before the termination.

It is reasonable to assume that the last reflection that can be detected during the calibration will be from the F-connector (from the cable modem side, not from the network side). The elapsed time measured between the transmission to the last detected reflection ("reference reflection") accounts for twice the elapsed time of the signal inside the cable modem (the first is from the transmitter to the F-connector and the second is from the F-connector to the receiver) and will be referred to as "reference latency."

When the cable modem 110 is connected to the cable plant, the first one or several reflections may be assigned to the internal (known) reflections. In the example of FIG. 7, the first two reflections 702, 704 may be the internal reflections. The first one 702 may be from the analog circuitry inside the cable modem 110 and the second one 704 may be from the F-connector. The cable modem 110 may have further reflections, such as reflections 706 and 708, coming from the network. For example, the reflection 706 may be from a wall plate and the reflection 708 may be from a point further away from the wall plate. The cable modem 110 may calculate the latency between such reflections to the reference latency. For example, the latency between the cable modem reference reflection to the reflection 706 from the network may be calculated as:

$$T_{L1}=T_{R1}-T_{R0}.$$

The distance to the point of the reflection 706 is then given by:

$$L_1 = \frac{V_{pr} \times T_{L1}}{2}.$$

Where $V_{pr}$ is the assumed propagation velocity of the electromagnetic wave in the cable plant medium. The division by two is because the wave travels the distance in both directions before being detected by the receiver. The latency between the cable modem reference reflection to the reflection 708 may be calculated similarly.

When any fault occurs in the cable plant (e.g. in the vicinity of the cable modem) the cable modem 110 (i.e. the processor 406) may detect the fault by detecting a change in the echo channel response (e.g. the time domain echo channel estimation coefficients), approximate the distance to the fault, and alert the monitoring subsystem that a fault may have occurred in the cable plant at the estimated distance from the cable modem.

Alternatively, the cable modem 110 may provide the data to the monitoring subsystem 140 and the monitoring subsystem 140 may determine the occurrence and/or location of the fault.

Figure 8:
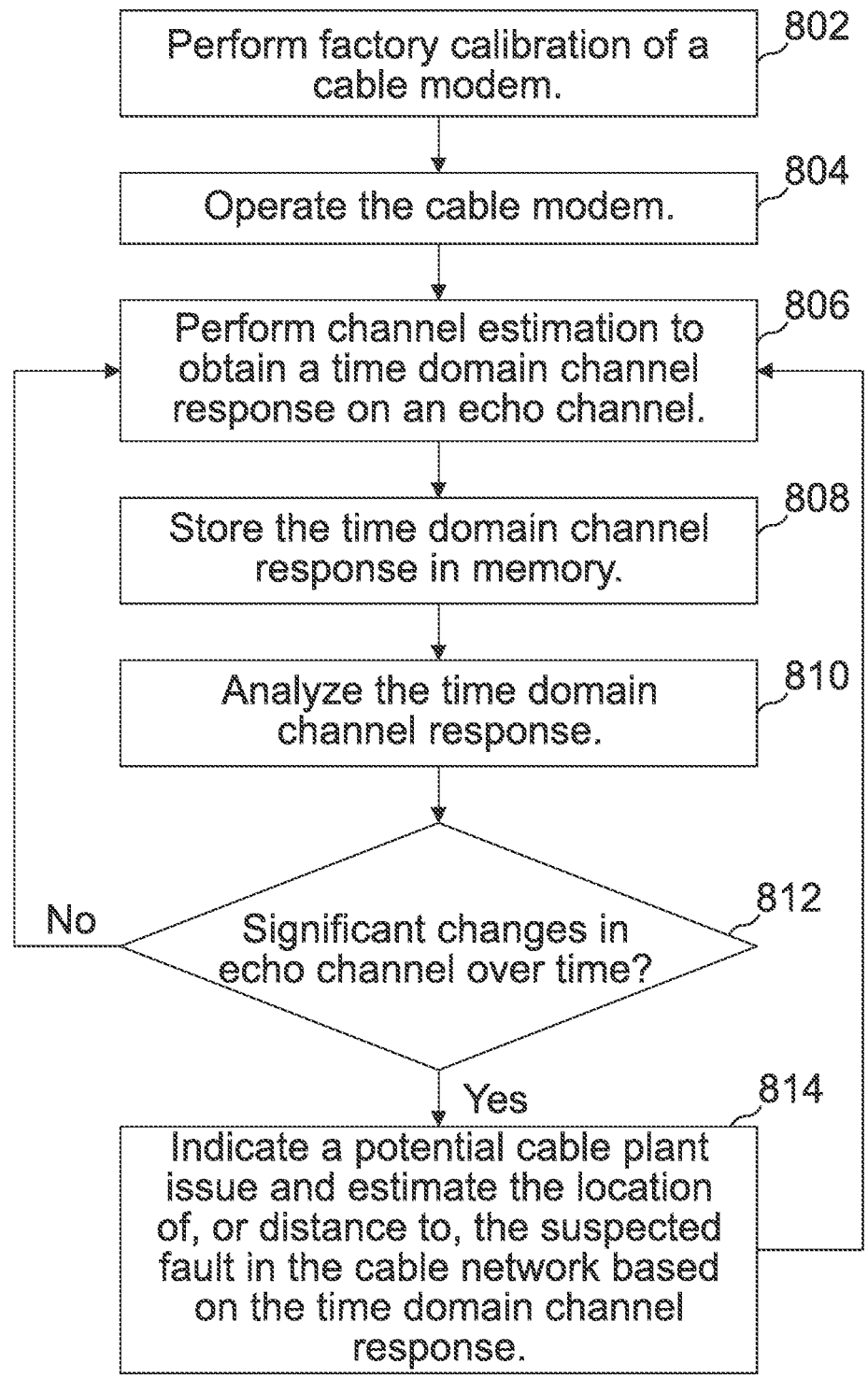
FIG. 8 is a flow diagram of an example process of detecting and locating a fault in a cable network in accordance with one aspect.

FIG. 8 is a flow diagram of an example process of detecting and locating a fault in a cable network in accordance with one aspect. Factory calibration may be performed on the cable modem 110 to determine the reference latency (i.e. the "zero distance") (802). The cable modem 110 is then connected to a cable network and put into operation (e.g. in an FDX mode) (804).

The cable modem 110 may perform channel estimation (either periodically or non-periodically) to obtain a time domain channel response(s) on an echo channel (806). The cable modem 110 may perform the channel estimation in frequency domain and convert the frequency domain channel estimation to a time domain channel estimation. Alternatively, the cable modem 110 may obtain the time domain channel response in time domain. The time domain channel response data (i.e. echo channel coefficients) may be stored in memory (e.g. stored in historical time domain echo channel coefficients database) (808). When a new echo channel response is obtained, the time domain echo channel coefficients may be analyzed to determine whether there is any change in the echo channel (810). For example, the new echo channel response may be compared to the previously obtained channel response(s) (e.g. the historical data).

In some cases, the changes in the cable plant may have different durations. Therefore, the newly obtained echo channel response may be compared to historical data to detect changed echo channel characteristics over time. This may increase the probability of a fault detection as some cable plant issues may take time to develop, e.g. change of the echo channel response characteristics due to moisture that gradually penetrates through the damaged shielding of a coaxial cable will be relatively slow and will take some time to fully show in the echo channel estimation data. The historical data, (e.g. the periodically generated time domain echo channel responses) may be stored in a database in the cable modem or any other network entity.

The generated time domain echo channel responses may be averaged over time and the averaged echo channel response may be compared to the newly obtained echo channel response.

Alternatively, any statistical processing may be performed to the time domain echo channel responses obtained periodically or non-periodically, and the processed echo channel response may be compared to the newly obtained echo channel response.

The comparison to the historical data may be done in the cable modem independently. For this purpose, the cable modem may store the echo channel estimation data for a pre-defined period of time and compare the newest echo channel estimation to the historical data. In another example, the historical echo channel response data may be stored in a monitoring subsystem 140 (e.g. a monitoring server) and the monitoring subsystem 140 may compare the channel estimates to detect and locate the fault in the cable plant.

Referring to FIG. 8, it is determined whether there is any change in the echo channel, (e.g. over time) (812). For example, it may be determined whether there is any significant change in the newly obtained echo channel response compared to the previous echo channel response (e.g. historic data). If there is no significant change, the process returns to step 806 to perform another channel estimation. If there is a significant change (e.g. a new peak in the echo channel coefficients above a threshold), the cable modem may indicate a potential cable plant issue, e.g. to the monitoring subsystem 140, and estimate the location of, or distance to, the suspected fault in the cable network (814).

The disclosed methods have many advantages. The network operator may implement pro-active network monitoring. In case of DOCSIS 3.1 FDX-compatible modem, it does not require additional dedicated hardware to implement the disclosed methods since the cable modem has echo cancellation capabilities and echo channel estimation is performed anyway as part of the echo cancelling functionality. In examples, cable plant faults close to the cable modem can be detected and located. In examples, not only the occurrence of fault, but also the distance from the cable modem to the fault may be estimated. The examples may allow detection of multiple faults simultaneously. The disclosed methods are independent from the CMTS and may work with any compatible monitoring tools, and not dependent on the CMTS receiver equalization. The disclosed methods may work even in the cases when pre-equalization is not enabled.

Another example is a computer program having a program code for performing at least one of the methods described herein, when the computer program is executed on a computer, a processor, or a programmable hardware component. Another example is a machine-readable storage including machine readable instructions, when executed, to implement a method or realize an apparatus as described herein. A further example is a machine-readable medium including code, when executed, to cause a machine to perform any of the methods described herein.

The examples as described herein may be summarized as follows:

Example 1 is an apparatus for detecting and locating a fault in a cable network. The apparatus includes a channel estimator for performing channel estimation to obtain a time domain channel response on an echo channel, and a processor for analyzing the time domain channel response to determine whether there is any change from a previously obtained time domain channel response on the echo channel and estimating a location of a fault in the cable network based on the time domain channel response if there is a change from the previously obtained time domain channel response.

Example 2 is the apparatus of example 1, wherein the channel estimation is performed in frequency domain and a frequency domain channel response is converted to the time domain channel response.

Example 3 is the apparatus as in any one of examples 1-2, wherein the previously obtained time domain channel response is an averaged value over a predetermined period of time.

Example 4 is the apparatus as in any one of examples 1-3, wherein the apparatus is a cable modem.

Example 5 is the apparatus as in any one of examples 1-4, wherein calibration is performed to determine a reference latency for a reflection occurred inside the cable modem, wherein the processor estimates the location of the fault based on the reference latency.

Example 6 is the apparatus as in any one of examples 1-5, wherein the channel estimation is performed on each of a plurality of sub-bands in a frequency domain and frequency domain channel responses for the plurality of sub-bands are combined and then transformed to the time domain channel response.

Example 7 is the apparatus as in any one of examples 1-6, wherein the channel estimation is performed on each of a plurality of sub-bands individually, and the fault is detected based on channel estimations on the plurality of sub-bands.

Example 8 is the apparatus as in any one of examples 1-7, wherein the cable network operates on a full duplex mode.

Example 9 is the apparatus as in any one of examples 1-8, further comprising an echo canceller for performing echo cancellation based on the channel estimation.

Example 10 is a method for detecting and locating a fault in a cable network. The method includes performing channel estimation to obtain a time domain channel response on an echo channel, analyzing the time domain channel response to determine whether there is any change in the echo channel, and estimating a location of a fault in the cable network based on the time domain channel response if it is determined that there is a change in the echo channel.

Example 11 is the method of example 10, wherein the channel estimation is performed in frequency domain and a frequency domain channel response is converted to the time domain channel response.

Example 12 is the method as in any one of examples 10-11, wherein the previously obtained time domain channel response is an averaged value over a predetermined period of time.

Example 13 is the method as in any one of examples 10-12, wherein the channel estimation and estimating the location of the fault are performed at a cable modem.

Example 14 is the method as in any one of examples 10-13, further comprising performing calibration to determine a reference latency for a reflection occurred inside the cable modem, wherein the location of the fault is estimating based on the reference latency.

Example 15 is the method as in any one of examples 10-14, wherein the channel estimation is performed on each of a plurality of sub-bands in a frequency domain and frequency domain channel responses for the plurality of sub-bands are combined and then transformed to the time domain channel response.

Example 16 is the method as in any one of examples 10-15, wherein the channel estimation is performed on each of a plurality of sub-bands individually, and the fault is detected based on channel estimations on the plurality of sub-bands.

Example 17 is the method as in any one of examples 10-16, wherein the cable network operates on a full duplex mode.

Example 18 is the method as in any one of examples 10-17, further comprising performing echo cancellation based on the channel estimation.

Example 19 is a non-transitory computer-readable storage medium for detecting and locating a fault in a cable network. The storage medium includes a code for performing channel estimation to obtain a time domain channel response on an echo channel of a cable modem and a code for analyzing the time domain channel response to determine whether there is any change from a previously obtained time domain channel response on the echo channel, and estimating a location of a fault in the cable network based on the time domain channel response if there is a change from the previously obtained time domain channel response.

Example 20 is the storage medium of example 19, wherein the channel estimation is performed on each of a plurality of sub-bands in a frequency domain and frequency domain channel responses for the plurality of sub-bands are combined and then transformed to the time domain channel response.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F) PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. An apparatus for detecting and locating a fault in a cable network, the apparatus comprising:
    a transmitter configured to operate on a first frequency band while in a full duplex (FDX) mode;
    a receiver configured to operate on a second frequency band while in the FDX mode;
    a channel estimator coupled to the receiver for performing channel estimation using a reference signal to obtain a time domain channel response on an echo channel, the time domain channel response relating to a signal transmitted by the transmitter; and
    a processor for analyzing the time domain channel response to determine whether there is any change from a previously obtained time domain channel response on the echo channel and estimating a location of a fault in the cable network, in view of a reference latency and historical data, based on the time domain channel response if there is a change above an echo channel threshold from the previously obtained time domain channel response, the reference latency being determined in conjunction with a calibration,
    wherein the channel estimation is performed on each of a plurality of sub-bands of a FDX band in a frequency domain and frequency domain channel responses for the plurality of sub-bands are combined to a wider-band frequency response and then transformed to the time domain channel response, and
    wherein the reference signal comprises a first element associated with the first frequency band and a second element associated with the second frequency band.

2. The apparatus of claim 1 wherein the previously obtained time domain channel response is an averaged value over a predetermined period of time.

3. The apparatus of claim 1, further comprising:
    an echo canceller for performing echo cancellation based on the channel estimation.

4. The apparatus of claim 1, wherein the change above the echo channel threshold includes a peak in one or more echo channel coefficients.

5. The apparatus of claim 1, wherein the transmitter and receiver are respectively configured to transmit and receive simultaneously in a same frequency band on adjacent frequencies.

6. The apparatus of claim 1, wherein the first frequency band and the second frequency band are separated by a frequency division.

7. The apparatus of claim 1, wherein the first frequency band and the second frequency band are configured without a filter between the first frequency band and the second frequency band.

8. A method for detecting and locating a fault in a cable network, the method comprising:
    performing channel estimation using a reference signal to obtain a time domain channel response on an echo channel, the time domain channel response relating to a signal transmitted by a transmitter in a full duplex (FDX) mode;

analyzing the time domain channel response to determine whether there is any change from a previously obtained time domain channel response in the echo channel; and estimating a location of a fault in the cable network, in view of a reference latency and based on the time domain channel response if it is determined that there is a change above an echo channel threshold in the echo channel, the reference latency being determined in conjunction with a calibration, wherein a change below the echo channel threshold in the echo channel is indicative of the fault being within a proximity range of a cable modem, wherein the channel estimation is performed on each of a plurality of sub-bands of a FDX band in a frequency domain and frequency domain channel responses for the plurality of sub-bands are combined to a wider-band frequency response and then transformed to the time domain channel response, and wherein the reference signal comprises a first element associated with a first frequency band and a second element associated with a second frequency band.

9. The method of claim 8 wherein the previously obtained time domain channel response is an averaged value over a predetermined period of time.

10. The method of claim 8, further comprising:
performing echo cancellation based on the channel estimation.

11. The method of claim 8, wherein the change above the echo channel threshold includes a peak in one or more echo channel coefficients.

12. The method of claim 8, wherein the location of the fault includes a distance to the fault.

13. A non-transitory computer-readable storage medium for detecting and locating a fault in a cable network, the storage medium comprising:
a code for performing channel estimation using a reference signal to obtain a time domain channel response on an echo channel of a cable modem, the time domain channel response relating to a signal transmitted by a transmitter in a full duplex (FDX) mode;

a code for analyzing the time domain channel response to determine whether there is any change above an echo channel threshold from a previously obtained time domain channel response on the echo channel in view of a reference latency, the reference latency being determined in conjunction with a calibration, and estimating a location of a fault in the cable network based on the time domain channel response if there is a change from the previously obtained time domain channel response; and a code for simultaneously determining a second fault in the cable network in view of at least one sub-band of a plurality of sub-bands, wherein the channel estimation is performed on each of the plurality of sub-bands of a FDX band in a frequency domain and frequency domain channel responses for the plurality of sub-bands are combined to a wider-band frequency response and then transformed to the time domain channel response, and wherein the reference signal comprises a first element associated with a first frequency band and a second element associated with a second frequency band.

14. The non-transitory computer-readable storage medium of claim 13, wherein the change above the echo channel threshold includes a peak in one or more echo channel coefficients.

15. The non-transitory computer-readable storage medium of claim 13, wherein the location of the fault includes a distance to the fault.

16. The non-transitory computer-readable storage medium of claim 14, wherein the second fault in the cable network is determined based on a second peak in the one or more echo channel coefficients.

* * * * *